(12) United States Patent
Rami et al.

(10) Patent No.: US 11,515,424 B2
(45) Date of Patent: Nov. 29, 2022

(54) FIELD-EFFECT TRANSISTORS WITH ASYMMETRIC GATE STACKS

(71) Applicant: Intel Corporation, Santa Clara, CA (US)

(72) Inventors: Said Rami, Portland, OR (US); Hyung-Jin Lee, Portland, OR (US); Saurabh Morarka, Hillsboro, OR (US); Guannan Liu, Portland, OR (US); Qiang Yu, San Jose, CA (US); Bernhard Sell, Portland, OR (US); Mark Armstrong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 782 days.

(21) Appl. No.: 16/270,826

(22) Filed: Feb. 8, 2019

(65) Prior Publication Data
US 2020/0259018 A1   Aug. 13, 2020

(51) Int. Cl.
*H01L 29/78*   (2006.01)
*H01L 29/51*   (2006.01)
(Continued)

(52) U.S. Cl.
CPC ...... *H01L 29/7856* (2013.01); *H01L 29/0673* (2013.01); *H01L 29/0847* (2013.01); *H01L 29/401* (2013.01); *H01L 29/42368* (2013.01); *H01L 29/42392* (2013.01); *H01L 29/4983* (2013.01); *H01L 29/512* (2013.01);
(Continued)

(58) Field of Classification Search
CPC ............... H01L 29/7856; H01L 29/775; H01L 29/0673; H01L 29/785
See application file for complete search history.

(56) References Cited

U.S. PATENT DOCUMENTS

| 2013/0181287 A1* | 7/2013 | Zhang | H01L 29/7816 |
| | | | 257/E29.256 |
| 2014/0217479 A1* | 8/2014 | Colinge | H01L 29/0649 |
| | | | 257/288 |

(Continued)

OTHER PUBLICATIONS

Miyata, T., et al., "150 GHz FMAX with High Drain Breakdown Voltage Immunity by Multi Gate Oxide Dual Work-Function (MGO-DWF)-MOSFET," 2015 IEEE International Electron Devices Meeting (IEDM), Washington, DC, Dec. 7-9, 2015, IEDM15-656-IEDM15-659; 4 pages.

*Primary Examiner* — Changhyun Yi
(74) *Attorney, Agent, or Firm* — Akona IP PC

(57) ABSTRACT

Disclosed herein are field-effect transistors with asymmetric gate stacks. An example transistor includes a channel material and an asymmetric gate stack, provided over a portion of the channel material between source and drain (S/D) regions. The gate stack is asymmetric in that a thickness of a gate dielectric of a portion of the gate stack closer to one of the S/D regions is different from that of a portion of the gate stack closer to the other S/D region, and in that a work function (WF) material of a portion of the gate stack closer to one of the S/D regions is different from a WF material of a portion of the gate stack closer to the other S/D region. Transistors as described herein exploit asymmetry in the gate stacks to improve the transistor performance in terms of high breakdown voltage, high gain, and/or high output resistance.

20 Claims, 11 Drawing Sheets

(51) Int. Cl.
*H01L 29/49* (2006.01)
*H01L 29/423* (2006.01)
*H01L 29/06* (2006.01)
*H01L 29/66* (2006.01)
*H01L 29/40* (2006.01)
*H01L 29/08* (2006.01)
*H01L 21/265* (2006.01)
*H01L 29/165* (2006.01)

(52) U.S. Cl.
CPC .......... *H01L 29/66795* (2013.01); *H01L 21/26513* (2013.01); *H01L 29/0649* (2013.01); *H01L 29/165* (2013.01); *H01L 29/42376* (2013.01); *H01L 29/66636* (2013.01)

(56) References Cited

U.S. PATENT DOCUMENTS

2015/0263167 A1* 9/2015 Miyata .............. H01L 29/66598
257/411
2020/0105914 A1* 4/2020 Afzalian ............. H01L 29/1054

* cited by examiner

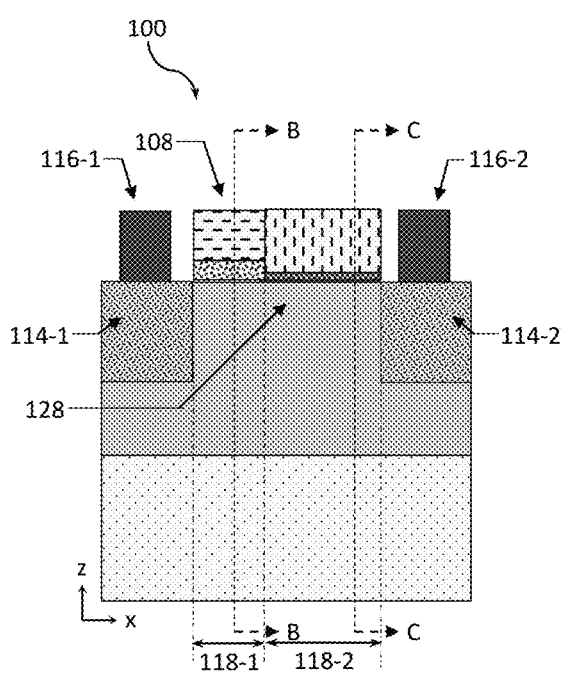
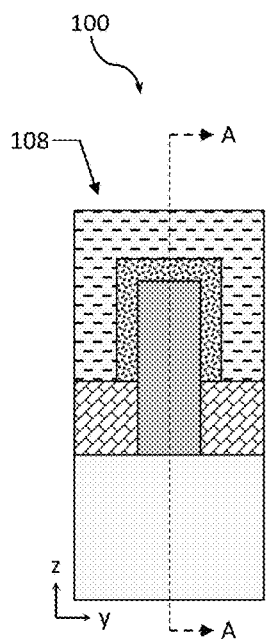
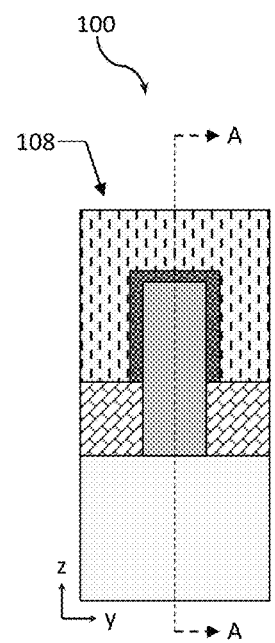
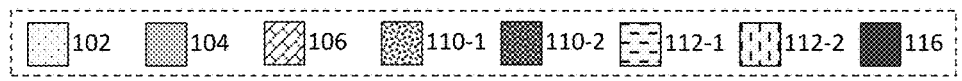
FIG. 2A  FIG. 2B  FIG. 2C

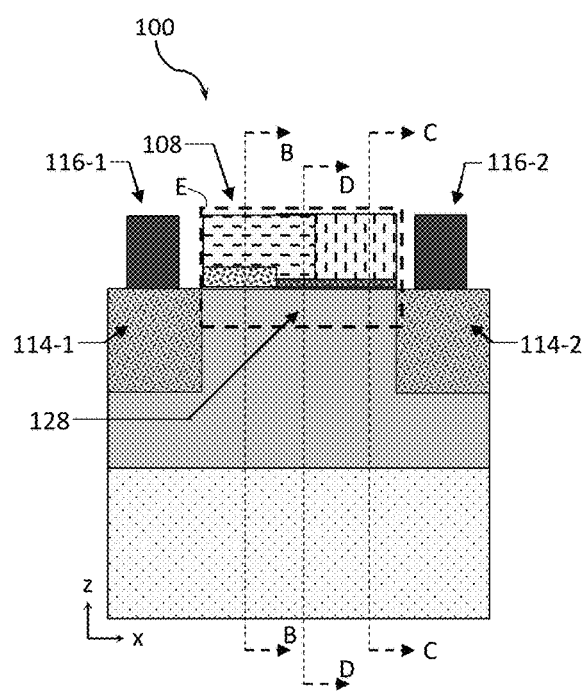
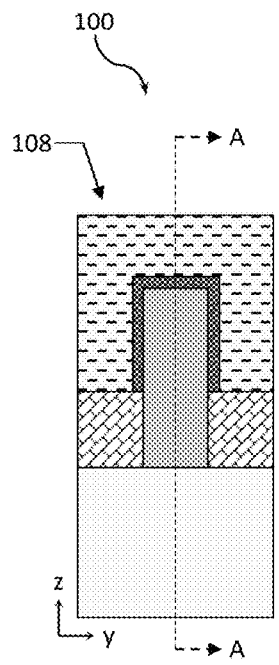
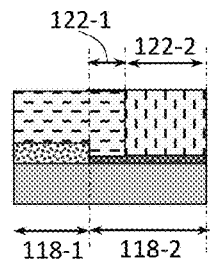
FIG. 3A    FIG. 3B    FIG. 3C
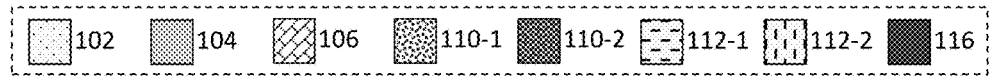

FIELD-EFFECT TRANSISTORS WITH ASYMMETRIC GATE STACKS

TECHNICAL FIELD

This disclosure relates generally to the field of semiconductor devices, and more specifically, to field-effect transistors (FETs).

BACKGROUND

A FET, e.g., a metal oxide semiconductor (MOS) FET (MOSFET), is a three-terminal device that includes source, drain, and gate terminals and uses electric field to control current flowing through the device. A FET typically includes a channel material, a source and a drain regions provided in the channel material, and a gate stack that includes a gate dielectric material and a gate electrode material, alternatively referred to as a "work function" (WF) material, provided over a portion of the channel material between the source and the drain regions.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2C are cross-sectional side views of an integrated circuit (IC) structure with an example FinFET with an asymmetric gate stack with aligned gate dielectric and WF materials portions, according to some embodiments of the disclosure.

FIGS. 3A-3C are cross-sectional side views of an IC structure with an example FinFET with an asymmetric gate stack with non-aligned gate dielectric and WF materials portions, according to some embodiments of the disclosure.

DETAILED DESCRIPTION

Overview

Figure 1:
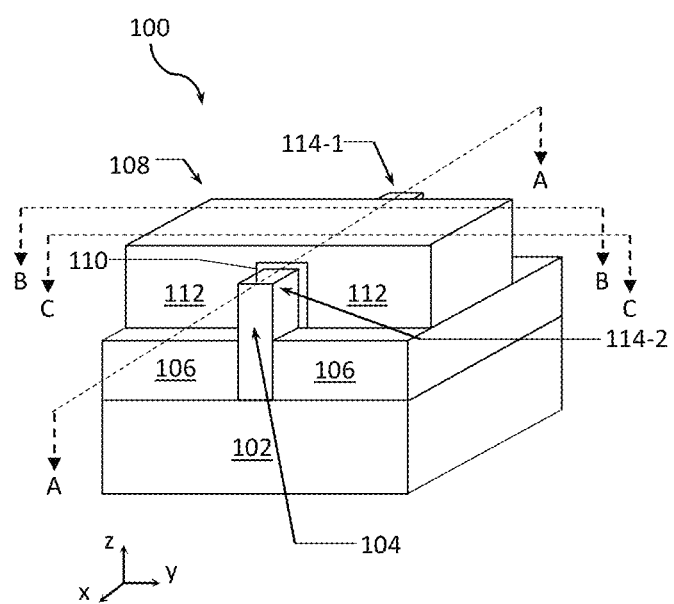
FIG. 1 is a perspective view of an example FinFET with an asymmetric gate stack, according to some embodiments of the disclosure.

For purposes of illustrating FETs with asymmetric gate stacks described herein, it might be useful to understand phenomena that may come into play in a transistor. The following foundational information may be viewed as a basis from which the present disclosure may be properly explained. Such information is offered for purposes of explanation only and, accordingly, should not be construed in any way to limit the broad scope of the present disclosure and its potential applications.

Performance of a FET may depend on the number of factors. Breakdown voltage of a FET is one of such factors. The breakdown voltage, commonly abbreviated as BVDS, refers to the drain-source voltage, VDS, which causes the FET to enter the breakdown region (i.e., the region where the transistor receives too much voltage across its drain-source terminal, which causes the drain-source terminal to break down, which makes the drain current, ID, drastically increase). Increasing the breakdown voltage of FETs would be desirable for a variety of applications, such as wireless radio frequency (RF) communications, in particular for mm-wave wireless technology such as fifth generation (5G) wireless (i.e., high frequency/short wavelength spectrum of RF, e.g., with frequencies in the range between about 20 and 60 GHz, corresponding to wavelengths in the range between about 5 and 15 millimeters), where FETs could realize circuits such as power amplifiers.

However, increasing the breakdown voltage of FETs, especially while also having sufficiently high speed of operation, is not an easy task. Therefore, applications that require high breakdown, high speed circuits typically resort to technologies other than silicon, such as GaN or other III-N materials. While III-N materials are very promising, it may still be desirable to implement FETs on silicon due to the cost advantage resulting from the use of known silicon processing technologies. Furthermore, for many applications, such as mm-wave RF connectivity, implementing FETs on silicon may advantageously enable a reduced form factor resulting from the ability to integrate RF circuits with logic circuits. Integration has many other benefits for mm-wave RF circuits as such circuits are increasingly relying on digital circuits to improve performance while supporting low latencies. Therefore, having a FET device that can sustain higher breakdown voltage, achieve sufficiently high speed, and be fabricated using complementary metal-oxide-semiconductor (CMOS) technology would be highly desirable.

Disclosed herein are FETs with asymmetric gate stacks that advantageously allow increasing the breakdown voltage. An example transistor may include a channel material and an asymmetric gate stack, provided over a portion of the channel material between source and drain (S/D) regions of the transistor. The gate stack is asymmetric in that a thickness of a gate dielectric of a portion of the gate stack closer to one of the S/D regions is different from that of a portion of the gate stack closer to the other S/D region (e.g., the gate dielectric in a portion of the gate stack closer to the drain region may be thicker than the gate dielectric in a portion of the gate stack closer to the source region). The gate stack is also asymmetric in that a WF material of a portion of the gate stack closer to one of the S/D regions is different from a WF material of a portion of the gate stack closer to the other S/D region. In particular, a WF material of a portion of the gate stack closer to one of the S/D regions may be a WF material corresponding to a first threshold voltage, while a WF material of a portion of the gate stack closer to the other S/D region may be a WF material corresponding to a second threshold voltage, different from the first threshold voltage (e.g., the WF material in a portion of the gate stack closer to the drain region may correspond to a lower threshold voltage than the WF material in a portion of the gate stack closer to the source region). In some embodiments of asymmetric gate stacks described herein, the different WF materials may be aligned with portions of gate dielectrics that have different thicknesses (i.e., the first WF material is provided over a portion of the gate dielectric having one thickness, while the second WF material is provided over a portion of the gate dielectric having another thickness). Such embodiments may be referred to as embodiments having "aligned gate dielectric and WF materials portions." In other embodiments of asymmetric gate stacks described herein, the different WF materials may not be aligned with portions of gate dielectrics that have different thicknesses (i.e., the first WF material may be provided both over a portion of the gate dielectric having one thickness and over a portion of the gate dielectric having another thickness, while the second WF material may be provided only over the remaining portion of the gate dielectric having the second thickness). Such embodiments may be referred to as embodiments having "non-aligned gate dielectric and WF materials portions." Various embodiments of FETs with asymmetric gate stacks as described herein may enable high performance devices that can sustain high breakdown voltages while providing performance comparable to those of thin-gate transistors (i.e., transistors with relatively thin gate dielectrics).

As used herein, the term "WF material" refers to any material that may be used for controlling the threshold voltage of a FET. The term "WF material" is used to indicate that it is the WF of the material (i.e., the physical property of the material specifying the minimum thermodynamic work (i.e. energy) needed to remove an electron from a solid to a point in the vacuum immediately outside the solid surface) that may affect the threshold voltage of the final FET. Further, the term "threshold voltage," commonly abbreviated as Vth, refers to the minimum gate electrode bias (or gate-source voltage) that is needed to create a conducting path (i.e., a conducting channel) between the source and the drain terminals of a transistor.

While some embodiments described herein refer to FinFETs (i.e., FETs having a non-planar architecture where a fin, formed of one or more semiconductor materials, extends away from a base), these embodiments are equally applicable to any other non-planar FETs besides FinFETs (e.g., to nanowire transistors), as well as to FETs having planar architecture.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium arsenide" or "GaAs" may refer to a material that includes Gallium and Arsenic). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 2A-2C, such a collection may be referred to herein without the letters, e.g., as "FIG. 2." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one FET with an asymmetric gate stack as described herein may be implemented in one or more components associated with an IC or/and between various such components. In various embodiments, components associated with an IC include, for example, transistors, diodes, power sources, resistors, capacitors, inductors, sensors, transceivers, transmitters, receivers, antennas, etc. Components associated with an IC may include those that are mounted on an IC, provided as an integral part of an IC, or those connected to an IC. The IC may be either analog or digital, or may include a combination of analog and digital circuitry, and may be used in a number of applications, such as microprocessors, optoelectronics, logic blocks, audio amplifiers, etc., depending on the components associated with the IC. In some embodiments, IC structures that include at least one FET with an asymmetric gate stack as described herein may be included in a RFIC, which may, e.g., be included in any component associated with an IC of an RF receiver, an RF transmitter, or an RF transceiver, or any other RF device, e.g., as used in telecommunications within base stations (BS) or user equipment (UE) devices. Such components may include, but are not limited to, power amplifiers, RF switches, RF filters (including arrays of RF filters, or RF filter banks), or impedance tuners. In some embodiments, the IC structures that include at least one FET with an asymmetric gate stack as described herein may be employed as part of a chipset for executing one or more related functions in a computer.

Example FinFET with an Asymmetric Gate Stack

Transistors can have planar or non-planar architecture. Recently, non-planar transistors have been extensively explored as alternatives to transistors with planar architectures.

FinFETs refer to transistors having a non-planar architecture where a fin, formed of one or more semiconductor materials, extends away from a base (where the term "base" refers to any suitable support structure on which a transistor may be built, e.g. a substrate). A portion of the fin that is closest to the base may be enclosed by an insulator material. Such an insulator material, typically an oxide, is commonly referred to as a "shallow trench isolation" (STI), and the portion of the fin enclosed by the STI is typically referred to as a "subfin portion" or simply a "subfin." A gate stack that includes at least a layer of a gate electrode material and a layer of a gate dielectric may be provided over the top and sides of the remaining upper portion of the fin (i.e. the portion above and not enclosed by the STI), thus wrapping around the upper-most portion of the fin. The portion of the fin over which the gate stack wraps around is referred to as a "channel portion" of the fin because this is where, during operation of the transistor, a conductive channel forms, and is a part of an active region of the fin. A source region and a drain region are provided on the opposite sides of the gate stack, forming, respectively, a source and a drain terminal of a transistor.

FinFETs may be implemented as "tri-gate transistors," where the name "tri-gate" originates from the fact that, in use, such a transistor may form conducting channels on three "sides" of the fin. FinFETs potentially improve performance relative to single-gate transistors and double-gate transistors.

FIG. 1 is a perspective view of an IC stricture with an example FinFET 100 in which an asymmetric gate stack may be implemented in accordance with either aligned or non-aligned embodiments of the disclosure. Note that the FinFET 100 shown in FIG. 1 is intended to show relative arrangement(s) of some of the components therein, and that the FinFET 100, or portions thereof, may include other components that are not illustrated (e.g., any further materials, such as e.g. spacer materials, surrounding the gate stack of the FinFET 100, electrical contacts to the S/D regions of the FinFET 100, etc.).

As shown in FIG. 1, the FinFET 100 may include a base 102, a fin 104, an STI material 106 enclosing the subfin portion of the fin 104, and S/D regions (also commonly referred to as "diffusion regions") 114-1 and 114-2. As also shown, the FinFET 100 also includes a gate stack 108 that includes a gate dielectric 110 and a gate electrode 112. Although not specifically shown in FIG. 1, it will be seen from, e.g., FIGS. 2 and 3, that the gate dielectric 110 may include two portions of different thicknesses, each of which may include a stack of one or more gate dielectric materials, while the gate electrode 112 may include two portions of different corresponding threshold voltages, each of which may include a stack of one or more WF materials.

In general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device implementing any of the FETs with asymmetric gate stacks as described herein may be built falls within the spirit and scope of the present disclosure. In various embodiments, the base 102 may include any such substrate material that provides a suitable surface for forming the FinFET 100.

As shown in FIG. 1, the fin 104 may extend away from the base 102 and may be substantially perpendicular to the base 102. The fin 104 may include one or more semiconductor materials, e.g. a stack of semiconductor materials, so that the upper-most portion of the fin (namely, the portion of the fin 104 enclosed by the gate stack 108) may serve as the channel region of the FinFET 100. Therefore, as used herein, the term "channel material" of a transistor may refer to such upper-most portion of the fin 104, or, more generally, to any portion of one or more semiconductor materials in which a conductive channel between source and drain regions is formed during operation of a transistor.

As shown in FIG. 1, the STI material 106 may enclose the sides of the fin 104. A portion of the fin 104 enclosed by the STI 106 forms a subfin. In various embodiments, the STI material 106 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 106 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 104, the gate stack 108 may wrap around the fin 104 as shown in FIG. 1, with a channel portion of the fin 104 corresponding to the portion of the fin 104 wrapped by the gate stack 108. In particular, the gate dielectric 110 may wrap around the upper-most portion of the fin 104, and the gate electrode 112 may wrap around the gate dielectric 110. The interface between the channel portion and the subfin portion of the fin 104 is located proximate to where the gate electrode 112 ends.

As will be shown in greater detail with reference to FIGS. 2 and 3, according to various embodiments of the present disclosure, the gate electrode 112 includes at least two portions corresponding to different threshold voltages (i.e., the material composition of the gate electrode 112 is different in each of such portions), each of which portions may include a stack of one or more WF materials. In particular, the gate electrode 112 may include portions that include different P-type WF metals or different N-type WF metals, depending on whether the FinFET 100 is a P-type metal oxide semiconductor (PMOS) transistor or an N-type metal oxide semiconductor (NMOS) transistor. Different P-type WF metals may be used in different portions of the gate electrode 112 when the FinFET 100 is a PMOS transistor, while different N-type WF metals may be used in different portions of the gate electrode 112 when the FinFET 100 is an NMOS transistor. For a PMOS transistor, metals that may be used in different portions of the gate electrode 112 may include, but are not limited to, ruthenium, palladium, platinum, cobalt, nickel, and conductive metal oxides (e.g., ruthenium oxide). For an NMOS transistor, metals that may be used in different portions of the gate electrode 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 112 may include a stack of a plurality of gate electrode materials, where one or more material of the stack are WF materials as described herein and at least one material of the stack is a fill metal layer. Further materials/layers may be included next to the gate material 112 for other purposes, such as to act as a diffusion barrier layer or/and an adhesion layer.

Similarly, as will be shown in greater detail with reference to FIGS. 2 and 3, according to various embodiments of the present disclosure, the gate dielectric 110 includes at least two portions having different thicknesses (where thickness of a gate dielectric refers to a dimension measured in the direction of the y-axis on the sidewalls of the fin 104 and a dimension measured in the direction of the z-axis on top of the fin 104, the y- and z-axes being different axes of a reference coordinate system x-y-z shown in FIG. 1), each of which portions may include a stack of one or more gate dielectric materials. In some embodiments, the gate dielectric 110 may include one or more high-k dielectric materials. In various embodiments, the high-k dielectric materials of the gate dielectric 110 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the FinFET 100 to improve the quality of the gate dielectric 110.

In some embodiments, the gate stack 108 may be surrounded by a dielectric spacer, not specifically shown in FIG. 1. The dielectric spacer may be configured to provide separation between the gate stacks 108 of different FinFETs 100 which may be provided along a single fin (e.g., different FinFETs provided along the fin 104, although FIG. 1 only illustrates one of such FinFETs), as well as between the gate stack 108 and the source/drain contacts disposed on each side of the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a dielectric spacer is used, then the lower portions of the fin 104, i.e. the subfin portion of the fin 104, may be surrounded by the STI material 106 which may e.g. include any of the high-k dielectric materials described herein.

In some embodiments, the fin 104 may be composed of semiconductor material systems including, for example, N-type or P-type materials systems. In some embodiments, the fin 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 104 may include a combination of semiconductor materials where one semiconductor material is used for the channel portion and another material, sometimes referred to as a "blocking material," is used for at least a portion of the subfin portion of the fin 104. In some embodiments, the subfin and the channel portions of the fin 104 are each formed of monocrystalline semiconductors, such as e.g. Si or Ge. In a first embodiment, the subfin and the channel portion of the fin 104 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For some example N-type transistor embodiments (i.e., for the embodiments where the FinFET 100 is an NMOS), the channel portion of the fin 104 may advantageously include a III-V material having a high electron mobility, such as, but not limited to InGaAs, InP, InSb, and InAs. For some such embodiments, the channel portion of the fin 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 104 may be an intrinsic III-V material, i.e. a III-V semiconductor material not intentionally doped with any electrically active impurity. In alternate embodiments, a nominal impurity dopant level may be present within the channel portion of the fin 104, for example to further fine-tune a threshold voltage Vt, or to provide HALO pocket implants, etc. Even for impurity-doped embodiments however, impurity dopant level within the channel portion of the fin 104 may be relatively low, for example below $10^{15}$ dopant atoms per cubic centimeter ($cm^{-3}$), and advantageously below $10^{13}$ $cm^{-3}$. The subfin portion of the fin 104 may be a III-V material having a band offset (e.g., conduction band offset for N-type devices) from the channel portion. Example materials, include, but are not limited to, GaAs, GaSb, GaAsSb, GaP, InAlAs, GaAsSb, AlAs, AlP, AlSb, and AlGaAs. In some N-type transistor embodiments of the FinFET 100 where the channel portion of the fin 104 is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 104 are each, or include, group IV semiconductors (e.g., Si, Ge, SiGe). The subfin of the fin 104 may be a first elemental semiconductor (e.g., Si or Ge) or a first SiGe alloy (e.g., having a wide bandgap).

For some example P-type transistor embodiments (i.e., for the embodiments where the FinFET 100 is a PMOS), the channel portion of the fin 104 may advantageously be a group IV material having a high hole mobility, such as, but not limited to Ge or a Ge-rich SiGe alloy. For some example embodiments, the channel portion of the fin 104 may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the fin 104, for example to further set a threshold voltage Vt, or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. The subfin of the fin 104 may be a group IV material having a band offset (e.g., valance band offset for P-type devices) from the channel portion. Example materials, include, but are not limited to, Si or Si-rich SiGe. In some P-type transistor embodiments, the subfin of the fin 104 is Si and at least a portion of the subfin may also be doped with impurities (e.g., N-type) to a higher impurity level than the channel portion.

The fin 104 may include a drain region 114-1 and a source region 114-2 (which may be interchanged) on either side of the gate stack 108, as shown in FIG. 1, thus realizing a transistor. As is known in the art, source and drain regions are formed for the gate stack of each FET. Although not specifically shown in FIG. 1, the FinFET 100 may further include source and drain electrodes, formed of one or more electrically conductive materials, for providing electrical connectivity to the source and drain regions 114, respectively. S/D regions 114 of the FinFET 100 (also sometimes interchangeably referred to as "diffusion regions") are regions of doped semiconductors, e.g. regions of doped channel material of the fin 104, so as to supply charge carriers for the transistor channel. Often, the S/D regions are highly doped, e.g. with dopant concentrations of about $1 \cdot 10^{21}$ $cm^{-3}$, in order to advantageously form Ohmic contacts with the respective S/D electrodes, although these regions may also have lower dopant concentrations and may form Schottky contacts in some implementations. Irrespective of the exact doping levels, the S/D regions 114 of the FinFET 100 are the regions having dopant concentration higher than in other regions, e.g. higher than a dopant concentration in a region between the source region 114-2 and the drain region 114-1, and, therefore, may be referred to as "highly doped" (HD) regions. In some embodiments, the source and drain regions may generally be formed using either an implantation/diffusion process or an etching/deposition process. In the former process, dopants such as boron, aluminum, antimony, phosphorous, or arsenic may be ion-implanted into the one or more semiconductor materials of the upper portion of the fin 104 to form the source and drain regions 114. An annealing process that activates the dopants and causes them to diffuse further into the fin 104 may follow the ion implantation process. In the latter process, the one or more semiconductor materials of the fin 104 may first be etched to form recesses at the locations for the future source and drain regions. An epitaxial deposition process may then be carried out to fill the recesses with material (which may include a combination of different materials) that is used to fabricate the source and drain regions 114. In some implementations, the source and drain regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the source and drain regions 114 may be formed using one or more alternate semiconductor materials such as germanium or a group III-V material or alloy. Although not specifically shown in the perspective illustration of FIG. 1, in further embodiments, one or more layers of metal and/or metal alloys may be used to form the source and drain contacts (i.e., electrical contacts to each of the source and drain regions 114).

The FinFET 100 may have a gate length, GL, (i.e. a distance between the source region 114-2 and the drain region 114-1), a dimension measured along the fin 104 in the direction of the x-axis of the example reference coordinate system x-y-z shown in FIG. 1, which may, in some embodiments, be between about 5 and 40 nanometers, including all values and ranges therein (e.g. between about 22 and 35 nanometers, or between about 20 and 30 nanometers). The fin 104 may have a thickness, a dimension measured in the direction of the y-axis of the reference coordinate system x-y-z shown in FIG. 1, that may, in some embodiments, be between about 5 and 30 nanometers, including all values and ranges therein (e.g. between about 7 and 20 nanometers, or between about 10 and 15 nanometers). The fin 104 may have a height, a dimension measured in the direction of the z-axis of the reference coordinate system x-y-z shown in FIG. 1, which may, in some embodiments, be between about 30 and 350 nanometers, including all values and ranges therein (e.g. between about 30 and 200 nanometers, between about 75 and 250 nanometers, or between about 150 and 300 nanometers).

Although the fin 104 illustrated in FIG. 1 is shown as having a rectangular cross section in a z-y plane of the reference coordinate system shown in FIG. 1, the fin 104 may instead have a cross section that is rounded or sloped at the "top" of the fin 104, and the gate stack 108 (including the different portions of the gate dielectric and different portions of the WF materials of the gate stack 108) may conform to this rounded or sloped fin 102. In use, the FinFET 100 may form conducting channels on three "sides" of the channel portion of the fin 104, potentially improving performance relative to single-gate transistors (which may form conducting channels on one "side" of a channel material or substrate) and double-gate transistors (which may form conducting channels on two "sides" of a channel material or substrate).

While FIG. 1 illustrates a single FinFET 100, in some embodiments, a plurality of FinFETs may be arranged next to one another (with some spacing in between) along the fin 104.

Example Asymmetric Gate Stack with Aligned Gate Dielectric and WF Material Portions FIGS. 2A-2C are cross-sectional side views of one example of the FinFET 100 shown in FIG. 1. Thus, descriptions provided with respect to FIG. 1 are applicable to FIGS. 2A-2C and, therefore, in the interests of brevity, are not repeated. In the example of the FinFET 100 illustrated in FIGS. 2A-2C, the gate stack 108 is an asymmetric gate stack with aligned gate dielectric and WF materials portions, according to some embodiments of the disclosure. The cross-sectional side view of FIG. 2A is the view in the x-z plane of the example coordinate system shown in FIG. 1 with the cross section taken along the fin 104 (e.g., along the plane shown in FIGS. 1, 2B, and 2C as a plane AA). The cross-sectional side view of FIG. 2B is the view in the y-z plane of the example coordinate system shown in FIG. 1 with the cross section taken across the fin 104 for one example portion of the gate stack 108 (e.g., along the plane shown in FIG. 1 and in FIG. 2A as a plane BB). The cross-sectional side view of FIG. 2C is the view in the y-z plane of the example coordinate system shown in FIG. 1 with the cross section taken across the fin 104 for another example portion of the gate stack 108 (e.g., along the plane shown in FIG. 1 and in FIG. 2A as a plane CC). A legend provided within a dashed box at the bottom of FIG. 2 illustrates colors/patterns used to indicate some portions or materials of some of the elements shown in FIG. 2, so that FIG. 2 is not cluttered by too many reference numerals. For example, FIG. 2 uses different colors/patterns to identify the base 102, the fin 104, the STI 106, etc.

As shown in FIG. 2, the gate dielectric 110 of the gate stacks 108 may include a first gate dielectric 110-1 and a second gate dielectric 110-2. As used herein, the differentiation between the first gate dielectric 110-1 and the second gate dielectric 110-2 is made in that these dielectric materials have different thicknesses, in particular, the first gate dielectric 110-1 being a portion of the gate dielectric 110 of the gate stack 108 that is thicker than a portion of the gate dielectric 110 represented by the second gate dielectric 110-2. In various embodiment, the material compositions of the first gate dielectric 110-1 and the second gate dielectric 110-2 may be the same or may be different, or the thicker portion of the gate dielectric (i.e., the first gate dielectric 110-1) may include a layer having one composition of one or more dielectric materials, and a layer having a composition of one or more dielectric materials of the thinner portion of the gate dielectric (i.e., of the second gate dielectric 110-2). Thus, in various embodiments, each of the first gate dielectric 110-1 and the second gate dielectric 110-2 may include any of the gate dielectric materials described above, and may be seen as being in contact with one another, e.g., as being a continuous layer of one or more gate dielectric materials with different portions of the layer having different thicknesses.

In some embodiments, as shown in FIG. 2A, the first gate dielectric 110-1 may be closer to the drain region 114-1 than the second gate dielectric 110-2, while the second gate dielectric 110-2 may be closer to the source region 114-2 than the first gate dielectric 110-1. Thus, the thickness of the portion of the gate dielectric 110 that is closest to the drain region 114-1 may be larger than the thickness of the portion of the gate dielectric 110 that is closest to the source region 114-2. For example, in some embodiments, the thickness of the first gate dielectric 110-1 may be between about 1.1 and 5 times larger than the thickness of the second gate dielectric 110-2 (e.g., about 2 times or about 3 times larger).

The first gate dielectric 110-1 may be seen as provided over a first portion of the channel material of the fin 104 (i.e., the upper-most portion of the fin 104, shown in FIG. 2A as a portion 128, the portion 128 being between the drain region 114-1 and the source region 114-2), while the second gate dielectric 110-2 may be seen as provided over a second portion of the channel material of the fin 104. In some embodiments, a ratio between a length of the first portion of the channel material (i.e., the dimension 118-1 shown in FIG. 2A, measured along the x-axis, i.e., along the length of the fin 104) and a length of the second portion of the channel material (i.e., the dimension 118-2 shown in FIG. 2A, measured along the x-axis as well) may be equal to or less than about 1, e.g., equal to or less than about ½, or equal to or less than about ⅓. In other words, in some embodiments, a ratio of a length of the thick gate dielectric (i.e., the length 118-1 of the first gate dielectric 110-1) and a length of the thin gate dielectric (i.e., the length 118-2 of the second gate dielectric 110-2) may be equal to or less than about 1, e.g., equal to or less than about ½, or equal to or less than about ⅓. Including, in the gate stack 108, a thicker portion of the gate dielectric near the drain region 114-1 (i.e., the gate dielectric portion of the length 118-1) that is shorter than a thinner portion of the gate dielectric near the source region 114-2 (i.e., the gate dielectric portion of the length 118-2) may have a number of advantages in various deployment scenarios. One is that it may allow improving the transconductance (Gm) without having to resort to very large Vt delta (in this case about 0.3 volts may be sufficient while otherwise more than about 0.5 volts might be needed). Another advantage is that it may help improve the output resistance of the device since the middle part of the gate (namely, the small Vt and thin oxide combination) may provide even higher gate control over the channel, without degrading the breakdown voltage as the high field region is concentrated on the drain side.

As also shown in FIG. 2, the gate electrode 112 of the gate stacks 108 may include a first WF material 112-1 and a second WF material 112-2. As used herein, the differentiation between the first WF material 112-1 and the second WF material 112-2 is made in that these WF materials are associated with different threshold voltages, meaning that, if a given transistor would include the first WF material 112-1 as the gate electrode material, such a transistor would have a first threshold voltage, and, if an otherwise the same transistor would include the second WF material 112-2 as the gate electrode material, such a transistor would have a second threshold voltage, different from the first threshold voltage. Thus, the first and second WF materials 112-1 and 112-2 are WF materials associated with, or corresponding to, different threshold voltages. According to various embodiments of the asymmetric gate stacks described herein, the WF material that is closest to the drain region of a transistor is the WF associated with a lower threshold voltage, while the WF material that is closest to the source region of a transistor is the WF associated with a higher threshold voltage. Thus, with reference to FIG. 2, the threshold voltage associated with the first WF material 112-1 is lower than the threshold voltage associated with the second WF material 112-2. For example, in some embodiments, the first WF material 112-1 may be associated with a threshold voltage between about 0.1 and 0.4 volts, while the second WF material 112-2 may be associated with a threshold voltage between about 0.5 and 0.9 volts. In general, a ratio between the threshold voltage of the first WF material 112-1 and the threshold voltage of the second WF material 112-2 may be below 1, including all values and ranges therein, e.g., below about ½, or below about ⅓.

The first and second WF materials 112-1 and 112-2 being associated with/corresponding to different threshold voltages means that the material compositions of the first and second WF materials 112-1 and 112-2 are different. In some embodiments, the first WF material 112-1 (i.e., the portion of the gate electrode 112 that is closest to the drain region 114-1) may be a material having a WF that is smaller than a WF of the second WF material 112-2 (i.e., of the portion of the gate electrode 112 that is closest to the source region 114-2). In some embodiments, the WF of the first WF material 112-1 may be smaller than the WF of the second WF material 112-2 by at least about 0.2 electronvolts, including all values and ranges therein, e.g., by at least about 0.4 electronvolts, or by at least about 1 electronvolt. In general, the ratio between the WF of the first WF material 112-1 and the WF of the second WF material 112-2 may be below 1, including all values and ranges therein, e.g., below about 0.8, or below about 0.4.

In some embodiments of the FinFET 100 being a PMOS transistor, the first WF material 112-1 may include one or more of TiN, NiSi, TiSi, TaN, W, Al, AlN, Mo, $HfSi_2$, La, Ru, and Co, while the second WF material 112-2 may include a different material selected from one or more of TiN, NiSi, TiSi, TaN, W, Al, AlN, Mo, $HfSi_2$, and La. In some embodiments of the FinFET 100 being an NMOS transistor, the first WF material 112-1 may include one or more of TiN, NiSi, TiSi, TaN, W, Al, AlN, Mo, $HfSi_2$, and La, while the second WF material 112-2 may include a different material selected from one or more of TiN, NiSi, TiSi, TaN, W, Al, AlN, Mo, $HfSi_2$, La, Ru, and Co.

The embodiment shown in FIG. 2 is aligned in that, as can be seen in the cross-section of FIG. 2A, the first WF material 112-1 is aligned with the first gate dielectric 110-1 (i.e., the length of the first WF material 112-1 as measured between the source and drain regions 114, i.e., as measured along the fin 104, may be substantially equal to the length 118-1 of the first gate dielectric 110-1), and the second WF material 112-2 is aligned with the first gate dielectric 110-2 (i.e., the length of the second WF material 112-2 as measured between the source and drain regions 114, i.e., as measured along the fin 104, may be substantially equal to the length 118-2 of the second gate dielectric 110-2). Thus, as shown in FIG. 2, in the aligned embodiments of the FinFET 100, the first gate dielectric 110-1 may be between a first portion of the channel material of the fin 104 (the portion of the channel material having the length 118-1) and the first WF material 112-1, while the second gate dielectric 110-2 may be between a second portion of the channel material of the fin 104 (the portion of the channel material having the length 118-2) and the second WF material 112-2, preferably with no portion of the first WF material 112-1 being over the second gate dielectric 110-2 and no portion of the second WF material 112-2 being over the first gate dielectric 110-1.

Example Asymmetric Gate Stack with Non-Aligned Gate Dielectric and WF Material Portions Turning to FIG. 3, FIGS. 3A-3C are cross-sectional side views of another example of the FinFET 100. Thus, descriptions provided with respect to FIG. 1 are applicable to FIGS. 3A-3C and, therefore, in the interests of brevity, are not repeated. In the example of the FinFET 100 illustrated in FIGS. 3A-3C, the gate stack 108 is an asymmetric gate stack with non-aligned gate dielectric and WF materials portions, according to some embodiments of the disclosure. The example of the FinFET 100 illustrated in FIGS. 3A-3C is similar to the example of the FinFET 100 illustrated in FIGS. 2A-2C, except for the non-alignment aspect. Therefore, descriptions provided with respect to FIGS. 2A-2C are applicable to FIGS. 3A-3C except for the alignment between the gate dielectrics 110-1, 110-2 and the WF materials 112-1, 112-2, and, therefore, in the interests of brevity, are not repeated and only differences are described.

Similar to FIG. 2A, the cross-sectional side view of FIG. 3A is the view in the x-z plane of the example coordinate system shown in FIG. 1 with the cross section taken along the fin 104 (e.g., along the plane shown in FIGS. 1, 2B, 2C, and 3B as a plane AA). FIG. 3A illustrates planes BB and CC but FIG. 3 does not specifically show these cross-sections because for the non-aligned embodiment of FIG. 3, cross-sections along the planes BB and CC would look the same as shown in FIGS. 2B and 2C for the aligned embodiment. FIG. 3A further illustrates a plane DD, where the cross-sectional side view of FIG. 3B is the view in the y-z plane of the example coordinate system shown in FIG. 1 with the cross section taken across the fin 104 for the non-aligned portion of the gate stack 108 (e.g., along the plane shown in FIG. 3B as the plane DD). The cross-sectional side view of FIG. 3C is an illustration of a portion E of the cross-section shown in FIG. 3A, provided so that the distances 118-1, 118-2, 122-1, and 122-2 may be labeled without cluttering the illustration of FIG. 3A.

As can be seen from FIG. 3, in contrast to the embodiment shown in FIG. 2, the embodiment shown in FIG. 3 is non-aligned in that the first WF material 112-1 extends to not only be over the first gate dielectric 110-1, but to also be over a portion of the second gate dielectric 110-2. More specifically, as shown in FIG. 3C, the first WF material 112-1 may be provided over the first gate dielectric 110-1 of the length 118-1 (as described above with reference to FIG. 2), and further provided over a first portion of the second gate dielectric 110-2, said first portion of the second gate dielectric 110-2 shown in FIG. 3C as having a length 122-1. On the other hand, as also shown in FIG. 3C, the second WF material 112-2 is provided not over the entire second gate dielectric 110-2, but only over a second portion of the second gate dielectric 110-2, said second portion of the second gate dielectric 110-2 shown in FIG. 3C as having a length 122-2. Thus, for the non-aligned embodiment of the FinFET 100, the length of the first WF material 112-1 as measured between the source and drain regions 114, i.e., as measured along the fin 104, may be substantially equal to the sum of the length 118-1 of the first gate dielectric 110-1 and the length 122-1 of the first portion of the second gate dielectric 110-2, while the length of the second WF material 112-2 as measured between the source and drain regions 114, i.e., as measured along the fin 104, may be substantially equal to the length 122-2 of the second portion of the second gate dielectric 110-2. Thus, as shown in FIG. 3, in the non-aligned embodiments of the FinFET 100, the first gate dielectric 110-1 may be between a first portion of the channel material of the fin 104 (the portion of the channel material having the length 118-1) and the first WF material 112-1, which is similar to the aligned embodiment shown in FIG. 2, while one portion of the second gate dielectric 110-2 may be between a portion of the channel material of the fin 104 (the portion of the channel material having the length 122-1) and the first WF material 112-1 and another portion of the second gate dielectric 110-2 may be between a portion of the channel material of the fin 104 (the portion of the channel material having the length 122-2) and the second WF material 112-2. In some non-aligned embodiments, a ratio of a length of the first portion of the second gate dielectric 110-2 (i.e., the length 122-1) and a length of the second portion of the second gate dielectric 110-2 (i.e., the length 122-2) may be equal to or less than about 1, e.g., equal to or less than about ½, or equal to or less than about ⅓.

Including, in the asymmetric gate stack 108, a thinner portion of the gate dielectric (i.e., the second gate dielectric 110-2) that is provided not only under the higher threshold voltage WF material (i.e., the second WF material 112-2) but also under a portion of the lower threshold voltage WF material (i.e., the first WF material 112-1) may advantageously allow further improvement in peak transconductance compared to when the boundaries of the WF materials and gate dielectrics of different thicknesses are aligned. Providing the WF material associated with the lower threshold voltage (i.e., the first WF material 112-1) over a portion of the thinner gate dielectric (i.e., the second gate dielectric 110-2) may change the charge profile by increasing channel inversion underneath this gate dielectric region, advantageously accelerating charge carriers. Additionally, the device becomes more impervious to mask misalignments since extra overlap of the WF material associated with the lower threshold voltage (i.e., the first WF material 112-1) over the thicker gate dielectric (i.e., the first gate dielectric 110-1) helps ensure that the thicker gate dielectric always stays under the lower threshold voltage WF material and, hence, uniformity of the performance across the wafer may be improved. It should be noted that, in some embodiments of the non-aligned FinFET 100 as shown in FIG. 3, the length of the thick gate dielectric (i.e., the length 118-1 of the first gate dielectric 110-1) may be greater than the length of the thin gate dielectric (i.e., the length 118-2 of the second gate dielectric 110-2), i.e., the ratio of these two lengths may be greater than 1. In other embodiments of the non-aligned FinFET 100 as shown in FIG. 3, the ratio between the length of the thick gate dielectric and the length of the thin gate dielectric may be equal to or less than about 1, e.g., equal to or less than about ½, or equal to or less than about ⅓, similar to what was described with reference to FIG. 2.

Other FETs with Asymmetric Gate Stacks

As briefly described above, asymmetric gate stacks as described herein may be implemented in FET of any desired architecture. Wrap-around or all-around gate transistors, such as nanoribbon and nanowire transistors, provide other examples of transistors having a non-planar architecture.

Figure 4:
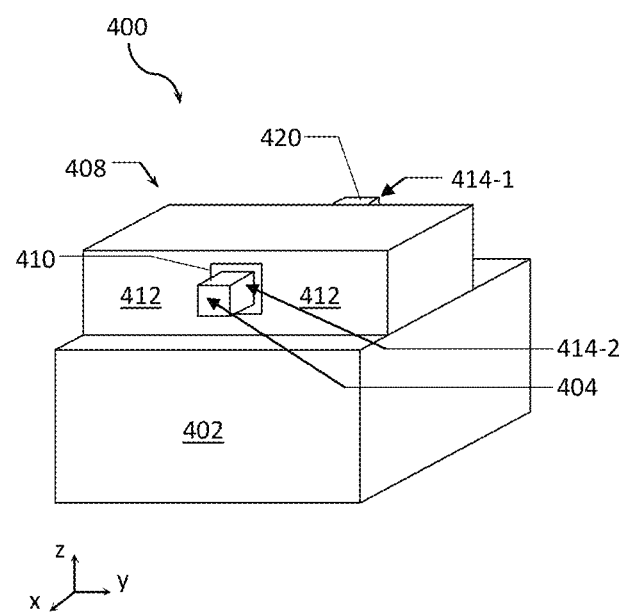
FIG. 4 is a perspective view of an example nanowire FET with an asymmetric gate stack, according to some embodiments of the disclosure.

FIG. 4 is a perspective view of an example all-around gate transistor 400 which may include an asymmetric gate stack in accordance with various embodiments described herein. The transistor 400 may include a channel material formed as a nanowire 404 made of one or more semiconductor materials, the nanowire 404 provided over a base 402. The nanowire 404 may take the form of a nanowire or nanoribbon, for example. A gate stack 408 including a gate electrode 412 and a dielectric 410 may wrap entirely or almost entirely around the wire 404 as shown in FIG. 4, with the active region of the channel material of the nanowire 404 corresponding to the portion of the wire 404 wrapped by the gate stack 408. In particular, the gate dielectric 410 may wrap around the nanowire 404 and the gate electrode 412 may wrap around the gate dielectric 410. In some embodiments, the gate stack 408 may fully encircle the nanowire 404. In some embodiments, a layer of oxide material (not specifically shown in FIG. 4) may be provided between the base 402 and the gate electrode 410. The nanowire 404 may include a drain region 414-1 and a source region 414-2 on the opposite sides of the gate stack 408, as shown in FIG. 4. The base 402, the channel material of the nanowire 404, the gate stack 408, the gate dielectric 410, the gate electrode 412, the source region 414-1 and the drain region 414-2 of the transistor 400 shown in FIG. 4 are analogous to the base 102, the channel material of the fin 104, the gate stack 108, the gate dielectric 110, the gate electrode 112, the source region 114-1 and the drain region 114-2 of the FinFET 100 shown in FIGS. 1-3 (except that in FIG. 4 the nanowire 404 is used instead of the fin 104). Therefore, descriptions of these elements provided with reference to FIGS. 1-3 are applicable to FIG. 4, and, therefore, in the interests of brevity, are not repeated.

Although not specifically illustrated in FIG. 4, a dielectric spacer may be provided between the source electrode and the gate stack as well as between the transistor drain electrode and the gate stack of the all-around-gate transistor 400 in order to provide electrical isolation between the source, gate, drain electrodes, similar to the spacer described above for the FinFET 100.

Furthermore, although the nanowire 404 illustrated in FIG. 4 is shown as having a rectangular cross section, the nanowire 404 may instead have a cross section that is rounded or otherwise irregularly shaped, and the gate stack may conform to the shape of the nanowire 404. In use, the all-around-gate transistor 400 may form conducting channels on more than three "sides" of the nanowire 404, potentially improving performance relative to FinFETs. Although FIG. 4 depicts an embodiment in which the longitudinal axis of the nanowire 404 runs substantially parallel to a plane of the base 402, this need not be the case; in other embodiments, the nanowire 404 may be oriented, e.g., "vertically" so as to be perpendicular to a plane of the base 402.

In some embodiments, multiple all-around-gate transistors similar to that shown in FIG. 4 may be provided along a single wire such as the nanowire 404, with considerations relevant to providing multiple devices on a single wire being known in the art and, therefore, in the interests of brevity, not specifically described here.

The transistor arrangements such as the FinFETs 100 illustrated in FIGS. 1-3 and all-around-gate transistors 400 illustrated in FIG. 4, and different variations of such arrangements, as described above, do not represent an exhaustive set of transistor arrangements in which a gate stack may be asymmetric in that it may include gate dielectric portions of different thicknesses and WF materials associated with different threshold voltages but merely provide examples of such arrangements. Although particular arrangements of materials are discussed with reference to FIGS. 1-4, intermediate materials may be included in the transistor devices of these figures. Note that FIGS. 1-4 are intended to show relative arrangements of the components therein, and that transistor arrangements of these figures may include other components that are not illustrated (e.g., S/D electrodes or various interfacial layers). Additionally, although various components of the transistor arrangements are illustrated in FIGS. 1-4 as being planar rectangles or formed of rectangular solids, this is simply for ease of illustration, and embodiments of these transistors may be curved, rounded, or otherwise irregularly shaped as dictated by, and sometimes inevitable due to, the manufacturing processes used to fabricate various components.

Example Circuits Implementing FETs with Asymmetric Gate Stacks

Figure 5A:
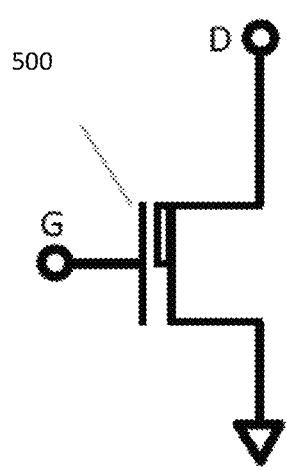
FIGS. 5A-5B are schematic circuit diagrams of circuits implementing FETs with asymmetric gate stacks, according to some embodiments of the disclosure.
Figure 5B:
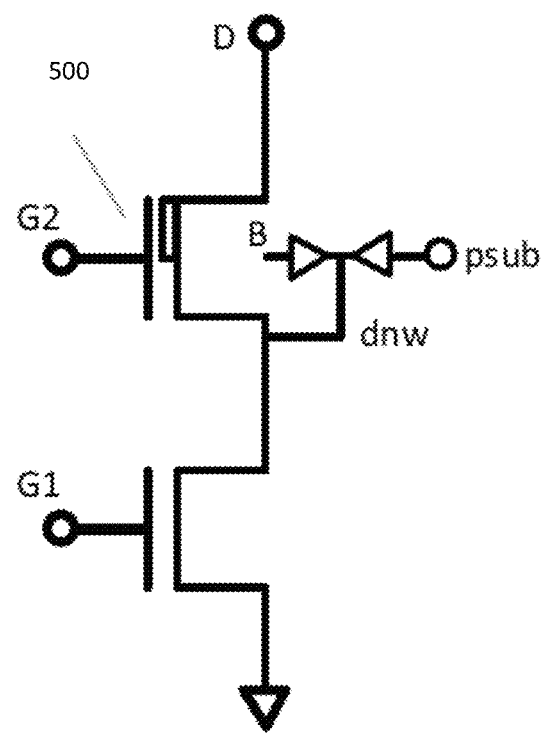

FIGS. 5A-5B are schematic circuit diagrams of circuits implementing FETs 500 with asymmetric gate stacks, according to some embodiments of the disclosure. Any of the FETs 500 shown in FIGS. 5A-5B may be any of the transistors with asymmetric gate stacks as described herein, e.g., any of the embodiments of the FinFET 100 as shown in FIGS. 1-3, any of the embodiments of the nanowire 400 as shown in FIG. 4, any further embodiments of the FinFET 100 and/or the nanowire FET 400 as described herein, or any other (e.g., planar) implementations of FETs as described herein.

The FETs with asymmetric gate stacks as described herein exploit asymmetry in the device to improve the transistor performance in terms of high breakdown voltage, high gain, and/or high output resistance. In some embodiments, such FETs may be used in MOS power devices. For example, in a power amplifier (e.g., the amplifier 2522 of the RF device 2500 shown in FIG. 11), a FET with an asymmetric gate stack may be used as a standalone common source as shown in FIG. 5A, or in a cascode configuration as shown in FIG. 5B (i.e., where the FET 500 is coupled to another transistor, shown in FIG. 5B as G1, e.g., by having their S/D terminals coupled or shared), if higher breakdown voltage is to be supported. Using at least one FET 500 with an asymmetric gate stack, e.g., as shown in FIG. 5A or FIG. 5B, may decrease the number of stacks of transistors compared to conventional approaches which keep increasing the number of stacks as the output power requirements increase at the cost of degraded performance due to additional parasitics associated with stacking. These parasitics may be reduced or eliminated when FETs with asymmetric gate stacks are implemented since each of such FETs may be seen as two transistors are merged into one.

Example Method of Manufacturing

Figure 6:
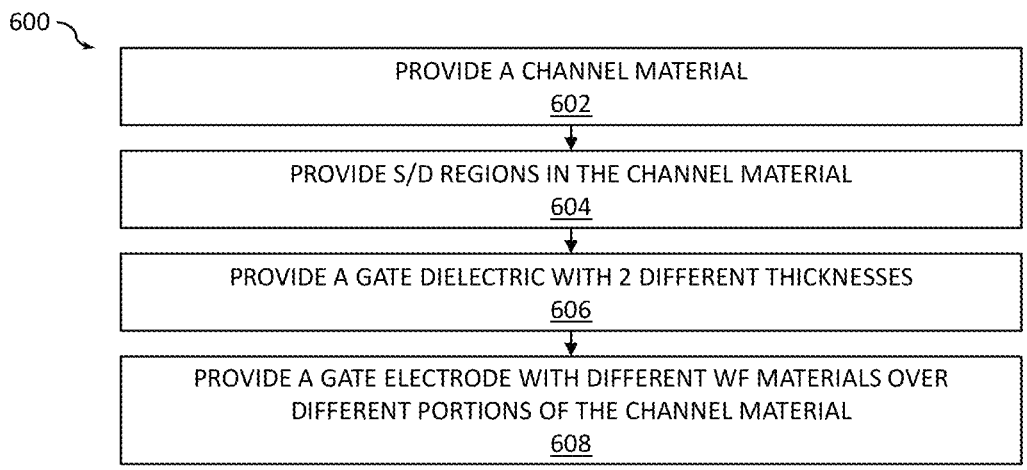
FIG. 6 is a flow diagram of an example method of manufacturing an IC structure with a FET with an asymmetric gate stack, according to some embodiments of the disclosure.

The IC structures implementing one or more transistor arrangements with at least one FET with an asymmetric gate stack according to various embodiments described herein may be manufactured using any suitable techniques. FIG. 6 illustrates one example of such a method. However, other examples of manufacturing any of the FETs with asymmetric gate stacks as described herein, as well as larger devices and assemblies that include such structures (e.g., as shown in FIGS. 7-11) are also within the scope of the present disclosure.

FIG. 6 is a flow diagram of an example method 600 of manufacturing a transistor arrangement that includes a FET with an asymmetric gate stack in accordance with various embodiments of the present disclosure.

Although the operations of the method 600 are illustrated once each and in a particular order, the operations may be performed in any suitable order and repeated as desired. For example, one or more operations may be performed in parallel to manufacture, substantially simultaneously, multiple FETs with asymmetric gate stacks as described herein. In another example, the operations may be performed in a different order to reflect the structure of a particular device assembly in which one or more FETs with asymmetric gate stacks as described herein will be included.

In addition, the example manufacturing method 600 may include other operations not specifically shown in FIG. 6, such as various cleaning or planarization operations as known in the art. For example, in some embodiments, the base 102/402, as well as layers of various other materials subsequently deposited thereon, may be cleaned prior to, after, or during any of the processes of the method 600 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the transistor structures/assemblies described herein may be planarized prior to, after, or during any of the processes of the method 600 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

In various embodiments, any of the processes of the method 600 may include any suitable patterning techniques, such as photolithographic or electron-beam (e-beam) patterning, possibly in conjunction with a suitable etching technique, e.g., a dry etch, such as RF reactive ion etch (RIE) or inductively coupled plasma (ICP) RIE. In various embodiments, any of the etches performed in the method 600 may include an anisotropic etch, using etchants in a form of e.g., chemically active ionized gas (i.e., plasma) using e.g., bromine (Br) and chloride (CI) based chemistries. In some embodiments, during any of the etches of the method 600, the IC structure may be heated to elevated temperatures, e.g., to temperatures between about room temperature and 200 degrees Celsius, including all values and ranges therein, to promote that byproducts of the etch are made sufficiently volatile to be removed from the surface.

The method 600 may begin with providing a channel material for the future transistor (process 602 shown in FIG. 6). The channel material provided in 602 may be one or more semiconductor materials for the channel portion of the fin 104 or one or more semiconductor materials for the nanowire 404 described above. The process 602 may include corresponding processes to shape the channel material in accordance with a particular transistor architecture of the FET being fabricated, e.g., to shape the channel material as a fin extending away from a base, or to shape the channel material as a nanowire. In some embodiments, the process 602 may include epitaxially growing one or more semiconductor materials to provide the channel material. In this context, "epitaxial growth" refers to the deposition of crystalline overlayers in the form of the desired materials. For example, the epitaxial growth of one or more layers of the process 602 may be carried out using any known gaseous or liquid precursors for forming the desired material layers.

The method 600 may then proceed with providing S/D regions in the channel material provided in 602 (process 604 shown in FIG. 6). The S/D regions provided in 604 may be the source region 114-2 and the drain region 114-1 as described above. Various techniques for providing S/D regions have been described above and include, e.g., either an implantation/diffusion process or an etching/deposition process.

The method 600 may include providing, over a portion of the channel material provided in 602, a gate dielectric of the future gate stack, where the gate dielectric includes different portions having different thicknesses (process 606 shown in FIG. 6). The gate dielectric provided in 606 may include the first gate dielectric 110-1 and the second gate dielectric 110-2 as described above. Any suitable deposition techniques may be used to deposit one or more dielectric materials of the first gate dielectric 110-1 and the second gate dielectric 110-2, such as, but not limited to, spin-coating, dip-coating, atomic layer deposition (ALD), physical vapor deposition (PVD) (e.g., evaporative deposition, magnetron sputtering, or e-beam deposition), or chemical vapor deposition (CVD).

The method 600 may include providing, over the gate dielectric provided in 606, a gate electrode of the future gate stack, where the gate electrode includes different portions having different WF materials (process 608 shown in FIG. 6). The gate electrode provided in 608 may include the first WF material 112-1 and the second WF material 112-2 as described above. Any suitable deposition techniques may be used to deposit one or more materials of each of the first WF material 112-1 and the second WF material 112-2, such as, but not limited to, ALD, PVD, CVD, or electroplating.

Example Structures and Devices Utilizing at Least One FET with an Asymmetric Gate Stack IC structures, or transistor arrangements, that include one or more FETs with asymmetric gate stacks as disclosed herein may be included in any suitable electronic device. FIGS. 7-11 illustrate various examples of devices and components that may include at least one FET with an asymmetric gate stack as disclosed herein.

Figures 7A, 7B:
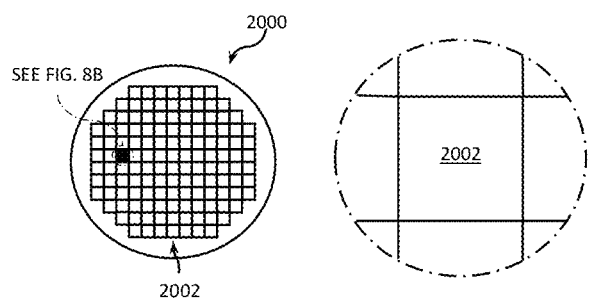
FIGS. 7A-7B are top views of a wafer and dies that include one or more FETs with asymmetric gate stacks in accordance with any of the embodiments of the present disclosure.

FIGS. 7A-7B are top views of a wafer 2000 and dies 2002 that may include at least one FET with an asymmetric gate stack in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 8. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including at least one FET with an asymmetric gate stack as described herein). After the fabrication of the semiconductor product is complete (e.g., after manufacture of at least one FET with an asymmetric gate stack as described herein, e.g., after manufacture of any embodiment of the IC structures shown in FIGS. 1-4, or any further embodiments of these structures described herein), the wafer 2000 may undergo a singulation process in which each of the dies 2002 is separated from one another to provide discrete "chips" of the semiconductor product. In particular, devices that include at least one FET with an asymmetric gate stack as disclosed herein may take the form of the wafer 2000 (e.g., not singulated) or the form of the die 2002 (e.g., singulated). The die 2002 may include at least one FET with an asymmetric gate stack (e.g., one or more FinFETs 100 as described herein), as well as, optionally, supporting circuitry to route electrical signals to the at least one FET with an asymmetric gate stack, as well as any other IC components. In some embodiments, the wafer 2000 or the die 2002 may implement an RF FE device, a memory device (e.g., a static random access memory (SRAM) device), a logic device (e.g., an AND, OR, NAND, or NOR gate), or any other suitable circuit element. Multiple ones of these devices may be combined on a single die 2002.

Figure 8:
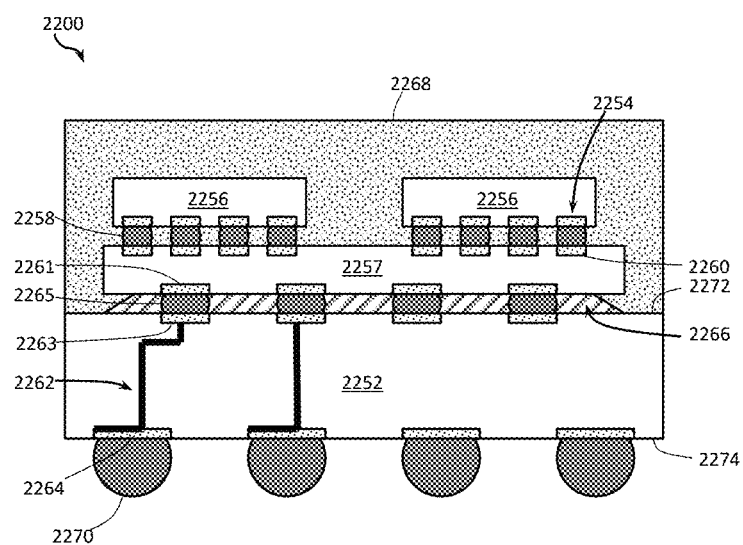
FIG. 8 is a cross-sectional side view of an IC package that may include one or more FETs with asymmetric gate stacks in accordance with any of the embodiments of the present disclosure.

FIG. 8 is a side, cross-sectional view of an example IC package 2200 that may include one or more IC structures having at least one FET with an asymmetric gate stack in accordance with any of the embodiments disclosed herein. In some embodiments, the IC package 2200 may be a system-in-package (SiP).

As shown in FIG. 8, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 8 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 8 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 8 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 9.

The dies 2256 may take the form of any of the embodiments of the die 2002 discussed herein and may include any of the embodiments of an IC structure having at least one FET with an asymmetric gate stack, e.g., any of the IC structures shown in FIGS. 1-4, or any further embodiments of at least one FET with an asymmetric gate stack, described herein. In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be RF FE dies and/or logic dies, including at least one FET with an asymmetric gate stack as described herein, one or more of the dies 2256 may be memory dies (e.g., high bandwidth memory), etc. In some embodiments, any of the dies 2256 may include at least one FET with an asymmetric gate stack, e.g., as discussed above; in some embodiments, at least some of the dies 2256 may not include any FETs with asymmetric gate stacks.

The IC package 2200 illustrated in FIG. 8 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 8, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 9:
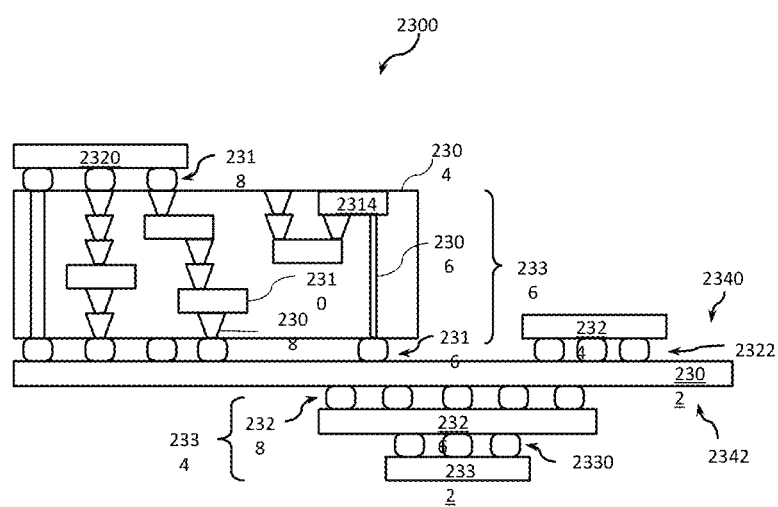
FIG. 9 is a cross-sectional side view of an IC device assembly that may include one or more FETs with asymmetric gate stacks in accordance with any of the embodiments of the present disclosure.

FIG. 9 is a cross-sectional side view of an IC device assembly 2300 that may include components having one or more IC structures implementing at least one FET with an asymmetric gate stack in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing at least one FET with an asymmetric gate stack in accordance with any of the embodiments disclosed herein; e.g., any of the IC packages discussed below with reference to the IC device assembly 2300 may take the form of any of the embodiments of the IC package 2200 discussed above with reference to FIG. 8 (e.g., may include at least one FET with an asymmetric gate stack in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 9 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 9), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 7B), an IC device (e.g., the IC structure of FIGS. 1-4), or any other suitable component. In particular, the IC package 2320 may include at least one FET with an asymmetric gate stack as described herein. Although a single IC package 2320 is shown in FIG. 9, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 9, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC structures implementing at least one FET with an asymmetric gate stack as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 9 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 10:
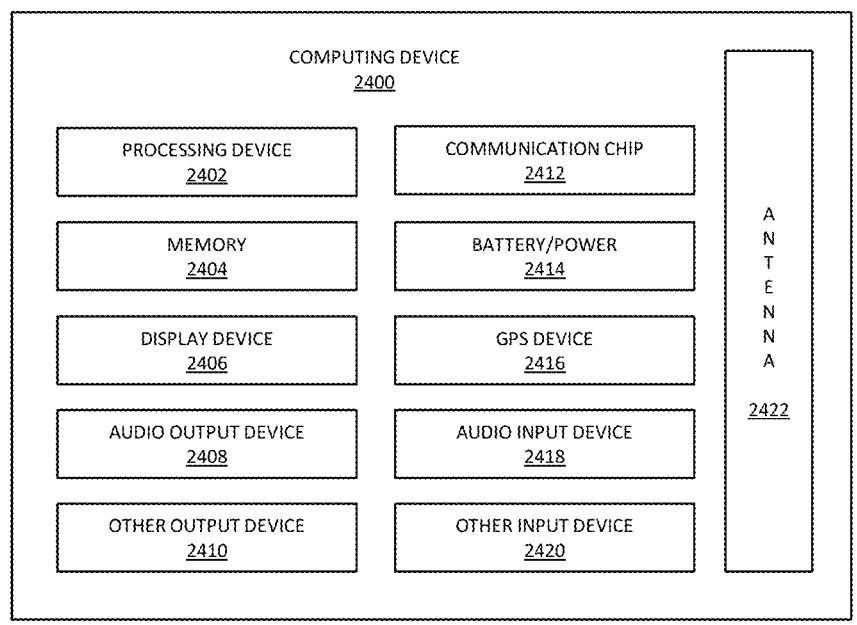
FIG. 10 is a block diagram of an example computing device that may include one or more FETs with asymmetric gate stacks in accordance with any of the embodiments of the present disclosure.

FIG. 10 is a block diagram of an example computing device 2400 that may include one or more components with one or more IC structures having at least one FET with an asymmetric gate stack in accordance with any of the embodiments disclosed herein. For example, any suitable ones of the components of the computing device 2400 may include a die (e.g., the die 2002 (FIG. 7B)) including at least one FET with an asymmetric gate stack in accordance with any of the embodiments disclosed herein. Any of the components of the computing device 2400 may include an IC device (e.g., any embodiment of the IC structure of FIGS. 1-4) and/or an IC package 2200 (FIG. 8). Any of the components of the computing device 2400 may include an IC device assembly 2300 (FIG. 9).

A number of components are illustrated in FIG. 10 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 10, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures with at least one FET with an asymmetric gate stack as described herein may be particularly advantageous for use within the one or more communication chips 2412, described above. For example, such IC structures with at least one FET with an asymmetric gate stack may be used to implement one or more of power amplifiers, low-noise amplifiers, filters (including arrays of filters and filter banks), switches, upconverters, downconverters, and duplexers, e.g., as a part of implementing an RF transmitter, an RF receiver, or an RF transceiver.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 11:
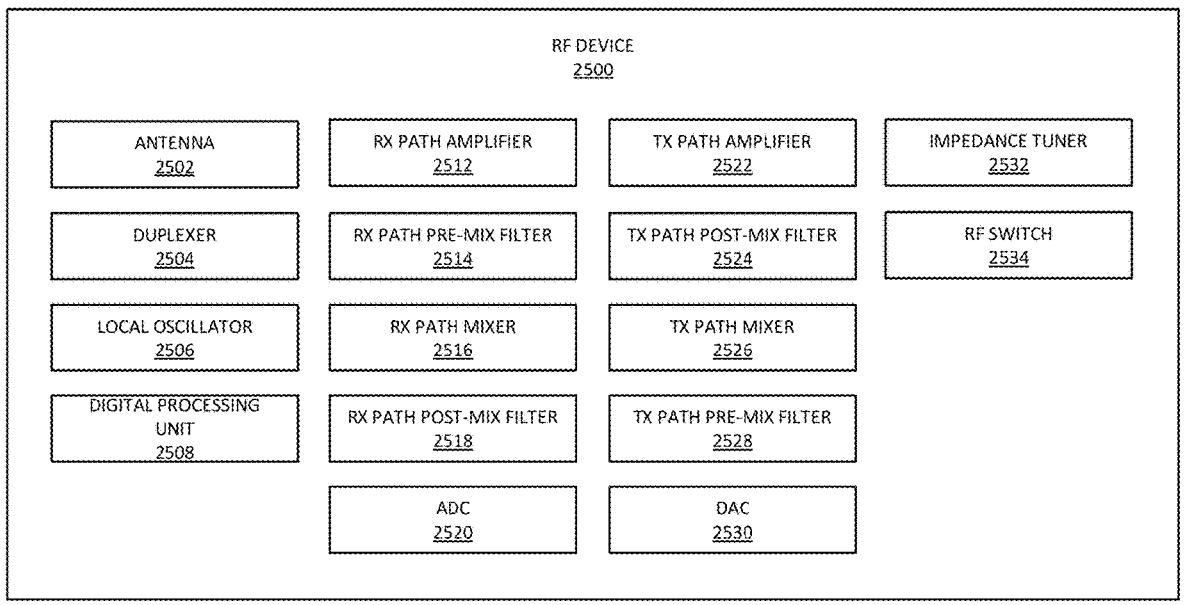
FIG. 11 is a block diagram of an example RF device that may include one or more FETs with asymmetric gate stacks in accordance with any of the embodiments of the present disclosure.

FIG. 11 is a block diagram of an example RF device 2500 that may include one or more components with one or more IC structures having at least one FET with an asymmetric gate stack in accordance with any of the embodiments disclosed herein. For example, any suitable ones of the components of the RF device 2500 may include a die (e.g., the die 2002 as described with reference to FIG. 7 or a die implementing the IC structure as described with reference to FIGS. 1-4) including at least one FET with an asymmetric gate stack in accordance with any of the embodiments disclosed herein. Any of the components of the RF device 2500 may include an IC device (e.g., the IC structure of FIGS. 1-4) and/or an IC package 2200 as described with reference to FIG. 8. Any of the components of the RF device 2500 may include an IC device assembly 2300 as described with reference to FIG. 9. In some embodiments, the RF device 2500 may be included within any components of the computing device 2400 as described with reference to FIG. 10, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 10, such as, but not limited to, the battery/power circuit 2414, the memory 2404, and various input and output devices as shown in FIG. 10.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a mm-wave wireless technology such as fifth generation (5G) wireless (i.e., high frequency/ short wavelength spectrum, e.g., with frequencies in the range between about 20 and 60 GHz, corresponding to wavelengths in the range between about 5 and 15 millimeters). In yet another example, the RF device 2500 may be used for wireless communications using WiFi technology (e.g., a frequency band of 2.4 GHz, corresponding to a wavelength of about 12 cm, or a frequency band of 5.8 GHz, spectrum, corresponding to a wavelength of about 5 cm), e.g., in a WiFi-enabled device such as a desktop, a laptop, a video game console, a smart phone, a tablet, a smart TV, a digital audio player, a car, a printer, etc. In some implementations, a WiFi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in FDD or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 11 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 11, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 11, the RF device 2500 may include an antenna 2502, a duplexer 2504, a local oscillator 2506, a digital processing unit 2508. As also shown in FIG. 11, the RF device 2500 may include an RX path which may include an RX path amplifier 2512, an RX path pre-mix filter 2514, a RX path mixer 2516, an RX path post-mix filter 2518, and an analog-to-digital converter (ADC) 2520. As further shown in FIG. 11, the RF device 2500 may include a TX path which may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532 and an RF switch 2534. In various embodiments, the RF device 2500 may include multiple instances of any of the components shown in FIG. 11. The RX path amplifier 2512, the TX path amplifier 2522, the duplexer 2504, and the RF switch 2534 may be considered to form, or be a part of, an RF FE of the RF device 2500. The RX path mixer 2516 and the TX path mixer 2526 (possibly with their associated pre-mix and post-mix filters shown in FIG. 11) may be considered to form, or be a part of, an RF transceiver of the RF device 2500 (or of an RF receiver or an RF transmitter if only RX path or TX path components, respectively, are included in the RF device 2500).

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, i.e., non-overlapping and non-continuous, bands of frequencies, e.g. in bands having a separation of, e.g., 20 MHz from one another. If the RF device 2500 is a TDD transceiver, the antenna 2502 may be configured for sequential reception and transmission of communication signals in bands of frequencies which may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (i.e., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals which may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 10, descriptions of which are provided above (when used as the digital processing unit 2508, the processing device 2402 may, but does not have to, implement any of the IC structures as described herein, e.g., IC structures having at least one FET with an asymmetric gate stack in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 11, in some embodiments, the RF device 2500 may further include a memory device, e.g., the memory device 2404 as described with reference to FIG. 10, configured to cooperate with the digital processing unit 2508. When used within, or coupled to, the RF device 2500, the memory device 2404 may, but does not have to, implement any of the IC structures as described herein, e.g., IC structures having at least one FET with an asymmetric gate stack in accordance with any of the embodiments disclosed herein.

Turning to the details of the RX path that may be included in the RF device 2500, the RX path amplifier 2512 may include an LNA. An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be, e.g., a harmonic or band-pass filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the downconverter 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 11, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset in phase from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog to digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a low-pass filter (or a pair of filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a PA, configured to amplify the upconverted RF signal before providing it to the antenna 2502 for transmission.

In various embodiments, any of the RX path pre-mix filter 2514, the RX path post-mix filter 2518, the TX post-mix filter 2524, and the TX pre-mix filter 2528 may be implemented as RF filters. In some embodiments, each of such RF filters may include one or more, typically a plurality of, resonators (e.g., film bulk acoustic resonators (FBARs), Lamb wave resonators, and/or contour-wave resonators), arranged, e.g., in a ladder configuration. An individual resonator of an RF filter may include a layer of a piezoelectric material such as aluminum nitride (AlN), enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators which may be coupled to a switch, e. g., the RF switch 2534, configured to selectively switch any one of the plurality of RF resonators on and off (i.e., activate any one of the plurality of RF resonators), in order to achieve desired filtering characteristics of the filter bank (i.e., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g. antenna's impedance changes depending on, e.g., if the antenna is held in a hand, placed on a car roof, etc.

As described above, the RF switch 2534 may be used to selectively switch between a plurality of instances of any one of the components shown in FIG. 11, in order to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500.

In various embodiments, FETs with asymmetric gate stacks as described herein may be particularly advantageous when used in any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534.

The RF device 2500 provides a simplified version and, in further embodiments, other components not specifically shown in FIG. 11 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable PLL, configured to receive a reference clock signal and use it to generate a different clock signal which may then be used for timing the operation of the ADC 2520, the DAC 2530, and/or which may also be used by the local oscillator 2506 to generate the local oscillator signals to be used in the RX path or the TX path.

SELECT EXAMPLES

The following paragraphs provide various examples of the embodiments disclosed herein.

Example 1 provides an IC structure having a transistor arrangement that includes a channel material provided over a portion of a support structure (e.g., a substrate, a die, or a chip); a source region and a drain region provided in the channel material; and a gate stack provided over a portion of the channel material that is between the source region and the drain region. The gate stack includes a first gate dielectric provided over a first portion of the channel material, a second gate dielectric provided over a second portion of the channel material, a first WF material provided over the first gate dielectric and a first portion of the second gate dielectric, and a second WF material provided over a second portion of the second gate dielectric. A thickness of the first gate dielectric is different from a thickness of the second gate dielectric, and a WF of the first WF material is different from a WF of the second WF material.

Example 2 provides the transistor arrangement according to example 1, where the first gate dielectric is in contact with the second gate dielectric.

Example 3 provides the transistor arrangement according to examples 1 or 2, where the first WF material is in contact with and, therefore, electrically continuous with the second WF material.

Example 4 provides the transistor arrangement according to any one of the preceding examples, where the first portion of the channel material is closer to the drain region than the second portion of the channel material, and the second portion of the channel material is closer to the source region than the first portion of the channel material.

Example 5 provides the transistor arrangement according to example 4, where the thickness of the first gate dielectric (i.e., the gate dielectric that is closest to the drain region) is larger than the thickness of the second gate dielectric (i.e., the gate dielectric that is closest to the source region), e.g., the thickness of the first gate dielectric may be between about 1.1 and 5 times larger than the thickness of the second gate dielectric (e.g., about 2 times or about 3 times larger).

Example 6 provides the transistor arrangement according to examples 4 or 5, where the WF of the first WF material (i.e., the WF material that is closest to the drain region) is smaller than the WF of the second WF material (i.e., the WF material that is closest to the source region).

Example 7 provides the transistor arrangement according to any one of the preceding examples, where the first WF material is a material associated with a threshold voltage below about 0.5 volts, e.g., between about 0.1 and 0.4 volts, and/or the second WF material is a material associated with a threshold voltage above about 0.5 volts, e.g., between about 0.5 and 0.9 volts.

Example 8 provides the transistor arrangement according to any one of the preceding examples, where a ratio between a length of the first portion of the channel material (i.e., the portion over which the first gate dielectric material is provided) and a length of the second portion of the channel material (i.e., the portion over which the second gate dielectric material is provided) is equal to or less than about 1, e.g., equal to or less than about ½, or equal to or less than about ⅓.

Example 9 provides the transistor arrangement according to any one of the preceding examples, where a ratio between a length of the first portion of the second gate dielectric (i.e., the portion over which the first WF material is provided) and a length of the second portion of the second gate dielectric (i.e., the portion over which the second WF material is provided) is equal to or less than about 1, e.g., equal to or less than about ½, or equal to or less than about ⅓.

Example 10 provides the transistor arrangement according to any one of examples 1-9, where the channel material is formed as a fin, extending away from the support structure, each of the first gate dielectric and the second gate dielectric wraps around an upper portion of the fin, the first WF material wraps around at least a portion of the first gate dielectric and around at least the first portion of the second gate dielectric, and the second WF material wraps around at least the second portion of the second gate dielectric.

Example 11 provides the transistor arrangement according to any one of examples 1-9, where the channel material is formed as a nanowire, provided substantially parallel to the support structure, each of the first gate dielectric and the second gate dielectric wraps around the nanowire, the first WF material wraps around at least a portion of the first gate dielectric and around at least the first portion of the second gate dielectric, and the second WF material wraps around at least the second portion of the second gate dielectric.

Example 12 provides the transistor arrangement according to any one of examples 1-11, where the transistor arrangement is a part of a RF device.

Example 13 provides the transistor arrangement according to example 12, where the transistor arrangement is a part of a power amplifier of an analog RF FE of the RF device.

Example 14 provides the transistor arrangement according to any one of examples 1-11, where the transistor arrangement is a part of a power circuit.

Example 15 provides a transistor arrangement that includes a channel material provided over a portion of a support structure (e.g., a substrate, a die, or a chip); a source region and a drain region provided in the channel material; and a gate stack provided over a portion of the channel material that is between the source region and the drain region. The gate stack includes a first gate dielectric provided over a first portion of the channel material, a second gate dielectric provided over a second portion of the channel material, a first WF material provided over the first gate dielectric (i.e., the first gate dielectric is between the first WF material and the first portion of the channel material), and a second WF material provided over the second gate dielectric (i.e., the second gate dielectric is between the second WF material and the second portion of the channel material). A WF of the first WF material is different from a WF of the second WF material, a thickness of the first gate dielectric is larger than a thickness of the second gate dielectric, and a ratio between a length of the first portion of the channel material (i.e., the portion over which the first gate dielectric material is provided) and a length of the second portion of the channel material (i.e., the portion over which the second gate dielectric material is provided) is equal to or less than about 1, e.g., equal to or less than about ½, or equal to or less than about ⅓.

Example 16 provides the transistor arrangement according to example 15, where the first gate dielectric is in contact with the second gate dielectric.

Example 17 provides the transistor arrangement according to examples 15 or 16, where the first WF material is in contact with and, therefore, electrically continuous with the second WF material.

Example 18 provides the transistor arrangement according to any one of examples 15-17, where the first portion of the channel material is closer to the drain region than the second portion of the channel material, and the second portion of the channel material is closer to the source region than the first portion of the channel material.

Example 19 provides the transistor arrangement according to example 18, where the thickness of the first gate dielectric (i.e., the gate dielectric that is closest to the drain region) is about 2 times or about 3 times larger than the thickness of the second gate dielectric (i.e., the gate dielectric that is closest to the source region).

Example 20 provides the transistor arrangement according to examples 18 or 19, where the WF of the first WF material (i.e., the WF material that is closest to the drain region) is smaller than the WF of the second WF material (i.e., the WF material that is closest to the source region).

Example 21 provides the transistor arrangement according to any one of examples 15-20, where the first WF material is a material associated with a threshold voltage below about 0.5 volts, e.g., between about 0.1 and 0.4 volts, and/or the second WF material is a material associated with a threshold voltage above about 0.5 volts, e.g., between about 0.5 and 0.9 volts.

Example 22 provides the transistor arrangement according to any one of examples 15-21, where the channel material is formed as a fin, extending away from the support structure, each of the first gate dielectric and the second gate dielectric wraps around an upper portion of the fin, the first WF material wraps around at least a portion of the first gate dielectric, and the second WF material wraps around at least a portion of the second gate dielectric.

Example 23 provides the transistor arrangement according to any one of examples 15-21, where the channel material is formed as a nanowire, provided substantially parallel to the support structure, each of the first gate dielectric and the second gate dielectric wraps around the nanowire, the first WF material wraps around at least a portion of the first gate dielectric, and the second WF material wraps around at least a portion of the second gate dielectric.

Example 24 provides the transistor arrangement according to any one of examples 15-23, where the transistor arrangement is a part of a RF device.

Example 25 provides the transistor arrangement according to example 24, where the transistor arrangement is a part of a power amplifier of an analog RF FE of the RF device.

Example 26 provides the transistor arrangement according to any one of examples 15-23, where the transistor arrangement is a part of a power circuit.

Example 27 provides an IC package that includes an IC die, including a transistor arrangement according to any one of the preceding examples (e.g., according to any one of examples 1-26); and a further IC component, coupled to the IC die.

Example 28 provides the IC package according to example 27, where the further IC component includes one of a package substrate, an interposer, or a further IC die.

Example 29 provides the IC package according to examples 27 or 28, where: 1) the IC package is included in one of a switch, a power amplifier, a low-noise amplifier, a filter, a filter bank, a duplexer, an upconverter, or a downconverter of an RF communications device, e.g. of an RF transceiver, and/or 2) the IC package is included in a base station of a wireless communication system or in a user equipment device (i.e., a mobile device) of a wireless communication system.

Example 30 provides an electronic device that includes a carrier substrate; and an IC die coupled to the carrier substrate, where the IC die includes the transistor arrangement according to any one of examples 1-26, and/or is included in the IC package according to any one of examples 27-29.

Example 31 provides the electronic device according to example 30, where the computing device is a wearable or handheld electronic device.

Example 32 provides the electronic device according to examples 30 or 31, where the electronic device further includes one or more communication chips and an antenna.

Example 33 provides the electronic device according to any one of examples 30-32, where the carrier substrate is a motherboard.

Example 34 provides the electronic device according to any one of examples 30-33, where the electronic device is an RF transceiver.

Example 35 provides the electronic device according to any one of examples 30-34, where the electronic device is one of a switch, a power amplifier, a low-noise amplifier, a filter, a filter bank, a duplexer, an upconverter, or a downconverter of an RF communications device, e.g. of an RF transceiver.

Example 36 provides the electronic device according to any one of examples 30-35, where the electronic device is included in a base station of a wireless communication system.

Example 37 provides the electronic device according to any one of examples 30-35, where the electronic device is included in a user equipment device (i.e., a mobile device) of a wireless communication system.

Example 38 provides a method of manufacturing an IC structure. The method includes forming a pair of S/D regions in a channel material provided over a portion of a support structure (e.g., a substrate, a die, or a chip); and providing a gate stack over a portion of the channel material between the pair of S/D regions, where the gate stack includes a first gate dielectric provided over a first portion of the channel material, a second gate dielectric provided over a second portion of the channel material, where a thickness of the first gate dielectric is different from a thickness of the second gate dielectric, a first WF material provided over the first gate dielectric and a first portion of the second gate dielectric, and a second WF material provided over a second portion of the second gate dielectric.

Example 39 provides the method according to example 38, where a WF of the first WF material is different from a WF of the second WF material.

Example 40 provides a method of manufacturing an IC structure. The method includes forming a pair of S/D regions in a channel material provided over a portion of a support structure (e.g., a substrate, a die, or a chip); and providing a gate stack over a portion of the channel material between the pair of S/D regions. The gate stack includes a first gate dielectric provided over a first portion of the channel material, a second gate dielectric provided over a second portion of the channel material, a first WF material provided over the first gate dielectric (i.e., the first gate dielectric is between the first WF material and the first portion of the channel material), and a second WF material provided over the second gate dielectric (i.e., the second gate dielectric is between the second WF material and the second portion of the channel material). A WF of the first WF material is different from a WF of the second WF material, a thickness of the first gate dielectric is larger than a thickness of the second gate dielectric, and a ratio between a length of the first portion of the channel material (i.e., the portion over which the first gate dielectric material is provided) and a length of the second portion of the channel material (i.e., the portion over which the second gate dielectric material is provided) is equal to or less than about 1, e.g., equal to or less than about ½, or equal to or less than about ⅓.

Example 41 provides the method according to any one of examples 38-40, where the IC structure is, or includes, the transistor arrangement according to any one of examples 1-26 and/or the IC structure is included within the IC package according to any one of examples 27-29 and/or within the electronic device according to any one of examples 30-37, and the method includes corresponding further processes to manufacture any of these IC structures.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a channel material;
a source region and a drain region in the channel material; and
a gate stack over a portion of the channel material that is between the source region and the drain region, the gate stack comprising:
a first gate dielectric over a first portion of the channel material,
a second gate dielectric over a second portion of the channel material,
a first work function (WF) material over the first gate dielectric and a first portion of the second gate dielectric, and
a second WF material over a second portion of the second gate dielectric,
wherein:
a thickness of the first gate dielectric is larger than a thickness of the second gate dielectric,
a WF of the first WF material is different from a WF of the second WF material, and
a ratio between a length of the first portion of the channel material and a length of the second portion of the channel material is equal to or less than 1.

2. The IC device according to claim 1, wherein:
the first portion of the channel material is closer to the drain region than the second portion of the channel material, and
the second portion of the channel material is closer to the source region than the first portion of the channel material.

3. The IC device according to claim 2, wherein:
the WF of the first WF material is smaller than the WF of the second WF material.

4. The IC device according to claim 1, wherein:
the first WF material is a material associated with a threshold voltage below about 0.5 volts, or
the second WF material is a material associated with a threshold voltage above about 0.5 volts.

5. The IC device according to claim 1, wherein:
a ratio between a length of the first portion of the second gate dielectric and a length of the second portion of the second gate dielectric is equal to or less than 1.

6. The IC device according to claim 1, wherein:
the channel material has a shape of a fin,
each of the first gate dielectric and the second gate dielectric wraps around an upper portion of the fin,
the first WF material wraps around at least a portion of the first gate dielectric and around at least the first portion of the second gate dielectric, and
the second WF material wraps around at least the second portion of the second gate dielectric.

7. The IC device according to claim 1, wherein:
the channel material has a shape of a nanowire,
each of the first gate dielectric and the second gate dielectric wraps around the nanowire,
the first WF material wraps around at least a portion of the first gate dielectric and around at least the first portion of the second gate dielectric, and
the second WF material wraps around at least the second portion of the second gate dielectric.

8. The IC device according to claim 1, wherein the IC device is a part of a radio frequency (RF) device.

9. The IC device according to claim 1, wherein the IC device is a part of a power circuit.

10. The IC device according to claim 1, wherein:
the IC device is an IC package that includes an IC die and a further component coupled to the IC die,
the IC die includes the channel material, the source region, the drain region, and the gate stack, and
the further component is one of a package substrate, a carrier substrate, an interposer, or a further IC die.

11. An integrated circuit (IC) device, comprising:
a channel material;
a source region and a drain region in the channel material; and
a gate stack over a portion of the channel material that is between the source region and the drain region, the gate stack comprising:
a first gate dielectric over a first portion of the channel material,
a second gate dielectric over a second portion of the channel material,
a first work function (WF) material over the first gate dielectric, and
a second WF material over the second gate dielectric,
wherein:
a WF of the first WF material is different from a WF of the second WF material,
a thickness of the first gate dielectric is larger than a thickness of the second gate dielectric, and
a ratio between a length of the first portion of the channel material and a length of the second portion of the channel material is less than 1.

12. The IC device according to claim 11, wherein:
the first portion of the channel material is closer to the drain region than the second portion of the channel material, and
the second portion of the channel material is closer to the source region than the first portion of the channel material.

13. The IC device according to claim 12, wherein:
the thickness of the first gate dielectric is about 2 times larger than the thickness of the second gate dielectric.

14. The IC device according to claim 12, wherein:
the WF of the first WF material is smaller than the WF of the second WF material.

15. The IC device according to claim 11, wherein:
the first WF material is a material associated with a threshold voltage between about 0.1 and 0.4 volts, or
the second WF material is a material associated with a threshold voltage between about 0.5 and 0.9 volts.

16. The IC device according to claim 11, wherein:
the channel material is formed as a fin,
each of the first gate dielectric and the second gate dielectric wraps around an upper portion of the fin,
the first WF material wraps around at least a portion of the first gate dielectric, and the second WF material wraps around at least a portion of the second gate dielectric.

17. The IC device according to claim 11, wherein:
the channel material is formed as a nanowire,
each of the first gate dielectric and the second gate dielectric wraps around the nanowire,
the first WF material wraps around at least a portion of the first gate dielectric, and
the second WF material wraps around at least a portion of the second gate dielectric.

18. The IC device according to claim 11, wherein the IC device is a part of a radio frequency (RF) device.

19. A method of manufacturing an integrated circuit (IC) structure, the method comprising:
forming a pair of source/drain (S/D) regions in a channel material; and
providing a gate stack over a portion of the channel material between the pair of S/D regions, wherein the gate stack includes:
a first gate dielectric over a first portion of the channel material,
a second gate dielectric over a second portion of the channel material, wherein a thickness of the first gate dielectric is larger than a thickness of the second gate dielectric,
a first work function (WF) material over the first gate dielectric and a first portion of the second gate dielectric,
a second WF material over a second portion of the second gate dielectric, and
a ratio between a length of the first portion of the channel material and a length of the second portion of the channel material is equal to or less than 1.

20. The method according to claim 19, wherein a WF of the first WF material is different from a WF of the second WF material.

* * * * *